(12) United States Patent
Lin et al.

(10) Patent No.: US 6,412,546 B1
(45) Date of Patent: Jul. 2, 2002

(54) HEAT DISSIPATION DEVICE FOR INTEGRATED CIRCUITS

(75) Inventors: Yeu-Lih Lin; Chao-Yang Lee, both of Taipei; Chung-Yung Sun, Kee-Lung; Chao Kun Tseng, Tu-Chen, all of (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/617,150

(22) Filed: Jul. 17, 2000

(30) Foreign Application Priority Data

Mar. 15, 2000 (TW) ...................................... 89204148 U

(51) Int. Cl.[7] .................................................. F28F 7/00
(52) U.S. Cl. ...................... 165/80.3; 165/185; 257/719; 257/722; 361/704; 411/339; 411/509; 411/510; 411/525; 411/526
(58) Field of Search ............................... 165/80.3, 80.4, 165/185, 104.33; 361/695, 697, 704–709; 257/718, 719, 722, 715; 411/338–339, 512, 525–526, 508–510

(56) References Cited

U.S. PATENT DOCUMENTS

| 491,019 | A | * | 1/1893 | Manson | 411/339 |
|---|---|---|---|---|---|
| 3,115,804 | A | * | 12/1963 | Johnson | 411/339 |
| 5,019,940 | A | * | 5/1991 | Clemens | 165/80.3 |
| 5,111,557 | A | * | 5/1992 | Baum et al. | 411/512 |
| 5,580,204 | A | * | 12/1996 | Hultman | 411/339 |
| 5,730,210 | A | * | 3/1998 | Kou | 165/80.3 |
| 5,735,340 | A | * | 4/1998 | Mira et al. | 165/80.3 |
| 5,943,210 | A | * | 8/1999 | Lee et al. | 165/80.3 |
| 6,008,990 | A | * | 12/1999 | Liu | 165/80.3 |
| 6,055,159 | A | * | 4/2000 | Sun | 165/80.3 |
| 6,097,601 | A | * | 8/2000 | Lee | 165/80.3 |
| 6,101,096 | A | * | 8/2000 | MacGregor et al. | 165/80.3 |
| 6,105,215 | A | * | 8/2000 | Lee | 165/80.3 |
| 6,112,378 | A | * | 9/2000 | Lee | 165/80.3 |
| 6,141,220 | A | * | 10/2000 | Lin | 165/80.3 |
| 6,212,014 | B1 | * | 4/2001 | Gonsalves et al. | 165/80.3 |

FOREIGN PATENT DOCUMENTS

JP  405013629  *  1/1993  ................. 259/718

* cited by examiner

*Primary Examiner*—Christopher Atkinson
(74) *Attorney, Agent, or Firm*—Wei Te Chung

(57) ABSTRACT

A heat dissipation device includes a heat sink (80) and an assembling device for securing the heat sink to a, chip (90) mounted on a printed circuit board (100). The heat sink has a pair of ears (82) each defining an aperture (84) therein. The assembling device includes a clip (70), a pair of sleeves (50) each defining a cavity (62) therethrough, and a pair of springs (60). Each sleeve extends through the aperture of a corresponding ear of the heat sink, and the springs are disposed respectively between the ears and an end of the sleeves. The clip has a pair of posts (66) for extending through the printed circuit board to engage with the corresponding cavities.

4 Claims, 6 Drawing Sheets

HEAT DISSIPATION DEVICE FOR INTEGRATED CIRCUITS

BACKGROUND

1. Field of the Invention

The present invention relates to a heat dissipation device, and particularly to a heat dissipation device which is readily attached to an integrated circuit.

2. The Related Art

A heat sink is usually mounted in contact with an integrated circuit (IC) for transferring heat through conduction therefrom. Various means have been developed for securing heat sinks to integrated circuits. Adhesive is generally used to attach heat sinks to integrated circuits. However, when attached to an integrated circuit by adhesive, a heat sink may peel off during transportation. Besides, heat sinks attached by adhesive cannot be removed from the integrated circuit for repair or replacement.

To counter the above problem, fastening members have been used in place of adhesives for securing heat sinks to integrated circuits. For example, referring to FIGS. 6 and 7, a heat sink 20 is mounted to an integrated circuit 40 by a plurality of pins 10. The heat sink 20 has a flat base 26 that defines a plurality of holes 28 therethrough for receiving the pins 10, and a plurality of fins 24 projecting upwardly from the top face thereof. Each pin 10 comprises a cylindrical head 12, a shaft body 14 and an insertion end 16. A spring 18 is disposed around the shaft body 14. The pin 10 is preferably formed with a narrow opening 22 laterally penetrating the insertion end 16 and extending into a portion of the shaft body 14 thereby providing compressive resiliency in the radial direction. In assembly, each pin 10 is inserted through the corresponding hole 28 in the flat base 26 of the heat sink 20 and engages the insertion end 16 thereof with a corresponding hole 32 defined in a printed circuit board 30 for securing the heat sink 20 to the chip 40. However, the size of the corresponding hole 32 in the printed circuit board 30 must be large enough to accommodate the shaft body 14 and the insertion end 16 of the pin 10. Therefore, the holes 32 occupy too much area on the printed circuit board 30. Additionally, although the pins 10 are releasable, the operation of releasing the pins 10 under the printed. circuit board 30 is inconvenient.

SUMMARY OF THE INVENTION

Accordingly, an object of the present invention is to provide a heat dissipation device having an assembling device allowing simple and ready attachment/detachment of the heat dissipation device to/from an integrated circuit.

Another object of the present invention is to provide a heat dissipation device having an assembling device that occupies a relatively small area of a printed circuit board.

To achieve the above-mentioned objects, a heat dissipation device in accordance with the present invention comprises a heat sink and an assembling device for securing the heat sink to a chip mounted on a printed circuit board. The heat sink has a pair of ears each defining an aperture therein. The assembling device includes a clip and a pair of sleeves wherein each sleeve defines a cavity extending therethrough. The sleeves are respectively inserted through the apertures of the ears of the heat sink, a pair of springs respectively being disposed between the ears and an end of the sleeves. The clip has a pair of posts for extending through the printed circuit board to engage with the corresponding cavities.

Other objects, advantages and novel features of the present invention will be apparent from the following detailed description of preferred embodiments of the present invention with reference to the attached drawings, in which:

DESCRIPTION OF THE PREFERRED EMBODIMENTS

Figure 1:
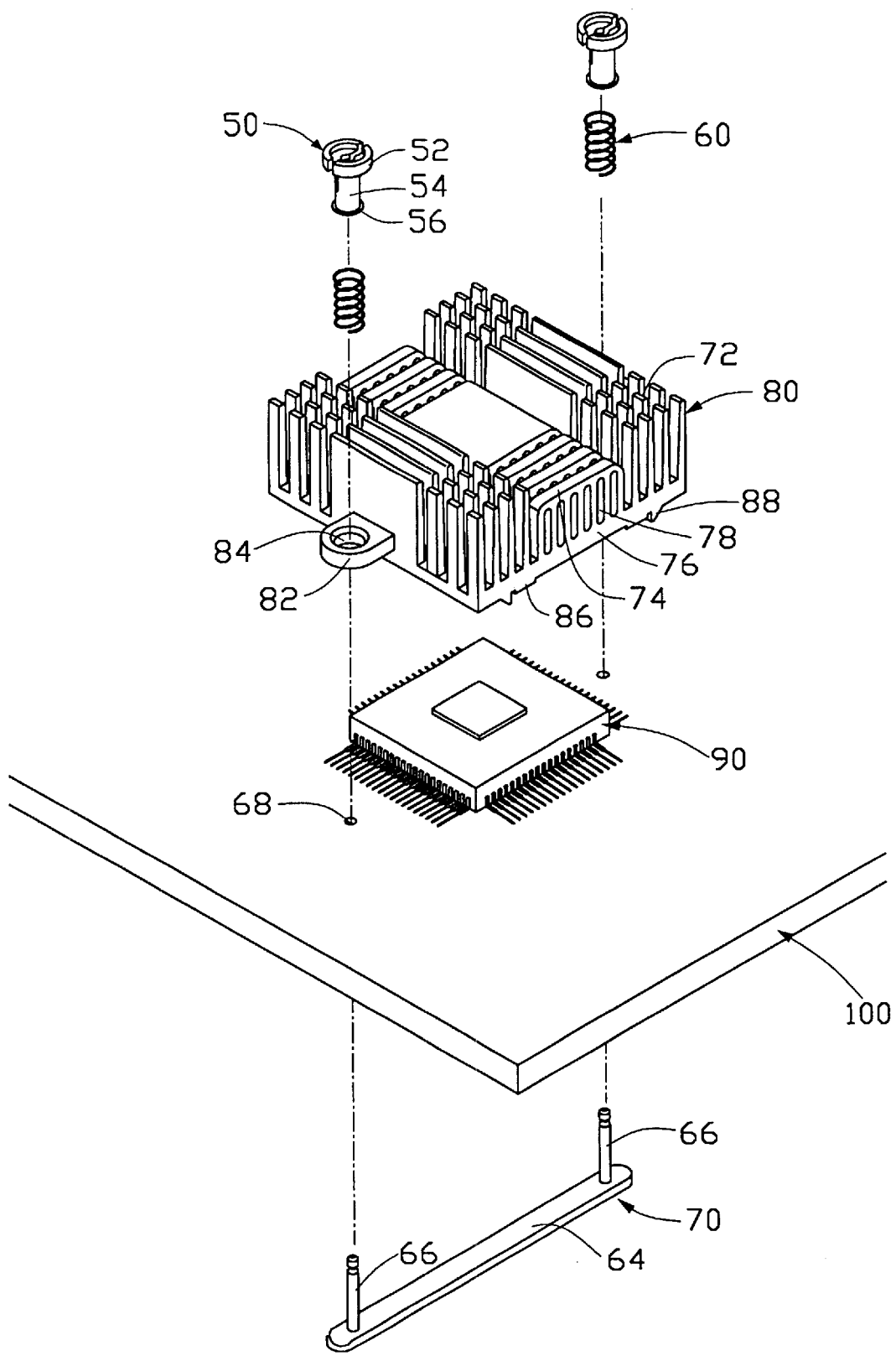
FIG. 1 is an exploded view of a heat dissipation device in accordance with the present invention to be attached to a chip on a printed circuit board.

Referring to FIG. 1, a heat dissipation device in accordance with the present invention comprises a heat sink 80 and an assembling device for securing the heat sink 80 to a chip 90 mounted on a printed circuit board 100. The heat sink 80 includes a flat plate 76 and a plurality of fins 72, 74 projecting upwardly from a top face of the flat plate 76. A pair of ribs 86 and a pair of retainers 88 extend downwards respectively symmetrically from a bottom face of the flat plate 76 for properly positioning the heat sink 80 with respect to the chip 90. A plurality of parallel grooves 78 is defined in the fins 74 on the central portion of the flat plate 76 for improving heat dissipation efficiency. A pair of ears 82 each defining an aperture 84 therein extends outwards from opposite sides of the flat plate 76. A pair of holes 68 is defined in the printed circuit board 100 corresponding to the apertures 84 of the heat sink 80.

Figure 4:
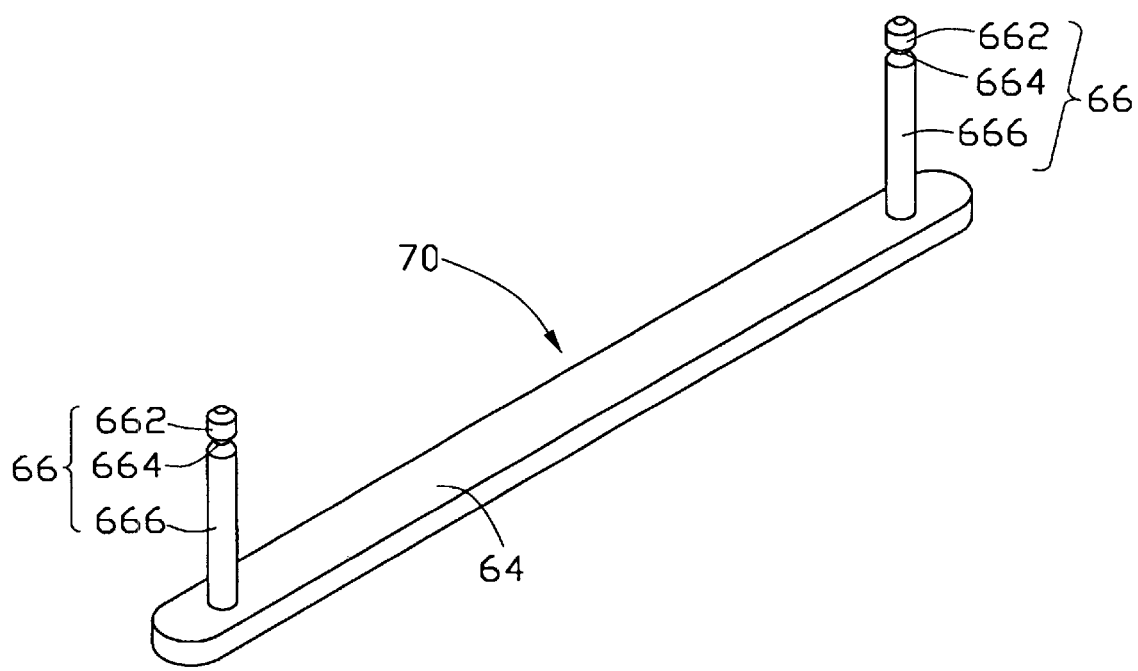
FIG. 4 is a perspective view of a clip of FIG. 1.

Also referring to FIG. 4, the assembling device comprises a clip 70, a pair of sleeves 50 and a pair of springs 60 respectively disposed around the corresponding sleeves 50. The clip 70 has a slat 64 and a pair of posts 66 extending from opposite ends thereof in the same direction. Each post 66 has a head 662, a neck 664 and a column body 666. The neck 664 joining the head 662 and the column body 666 has a cross-sectional size smaller than those of the head and the body 666. Furthermore, it is readily apparent that two independent posts 66 each with a base in place of the slat 64 will be nearly as efficient as the clip 70.

Figure 2:
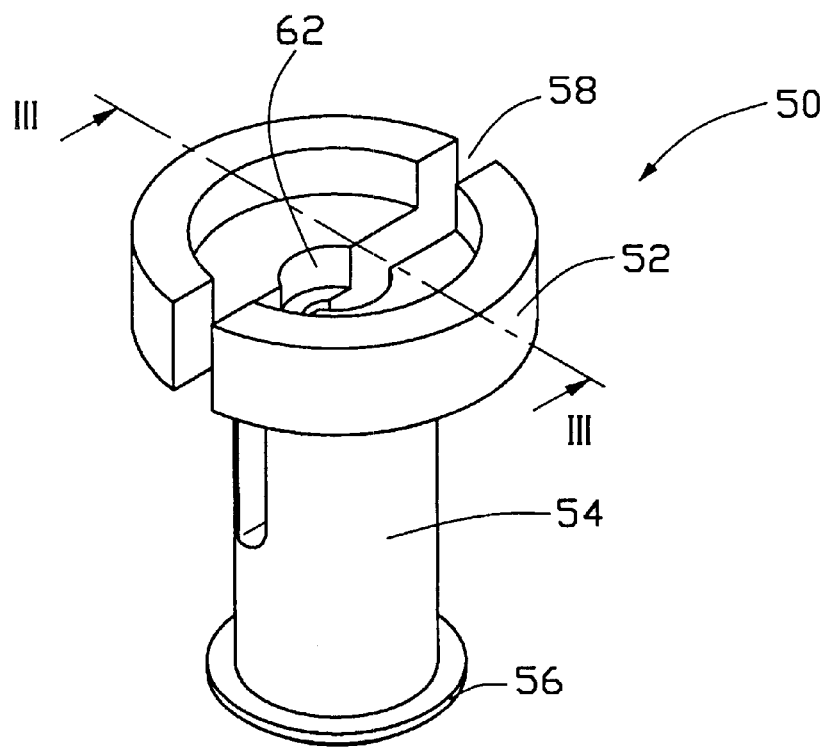
FIG. 2 is a perspective view of a sleeve of FIG. 1.
Figure 3:
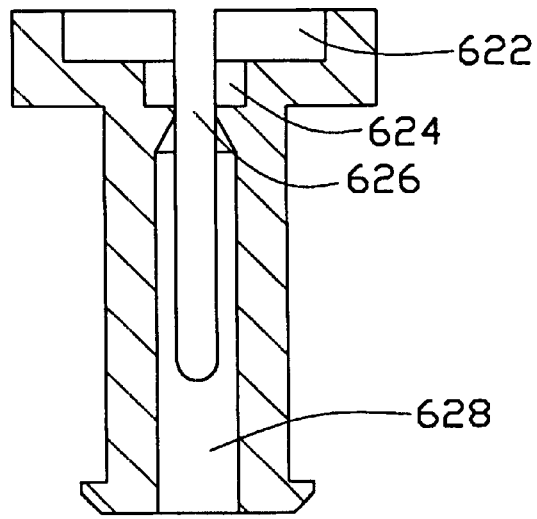
FIG. 3 is a cross-sectional view taken along line III—III of FIG. 2.

Referring to FIGS. 1–3, each sleeve 50 includes a cap 52, a cylindrical section 54 and a cone-shaped end 56. A cavity 62 is defined lengthways through each sleeve. The cylindrical section 54 joins the cap 52 and the end 56, and has a smaller cross-sectional dimension than that of the cap 52 or the end 56. The cavity 62 is composed of a plurality of different dimension apertures 622, 624, 626, 628 arranged one above the other. The aperture 626 with the smallest dimension is for engagingly receiving the neck 664 of the post 66. In addition, a slot 58 is defined in the cap 52 and the cylindrical section 54 to provide resilience thereto.

Figure 5:
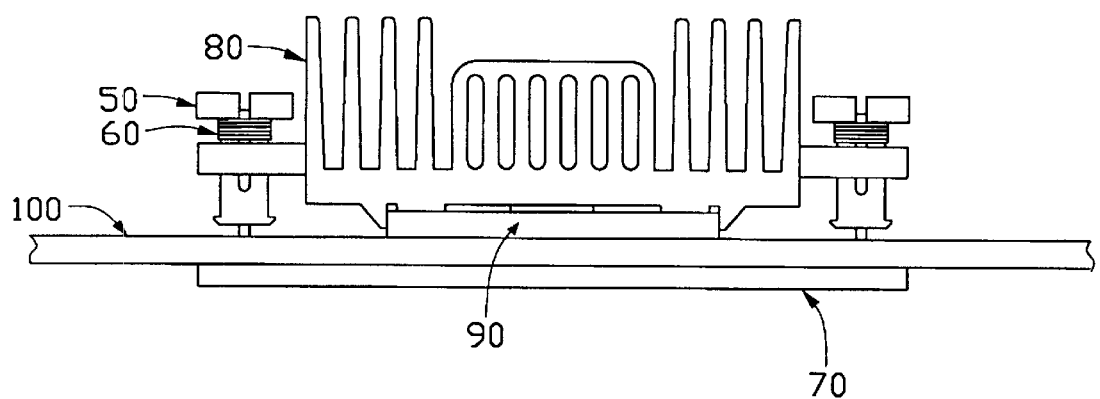
FIG. 5 is an assembled side view of FIG. 1.
Figure 6:
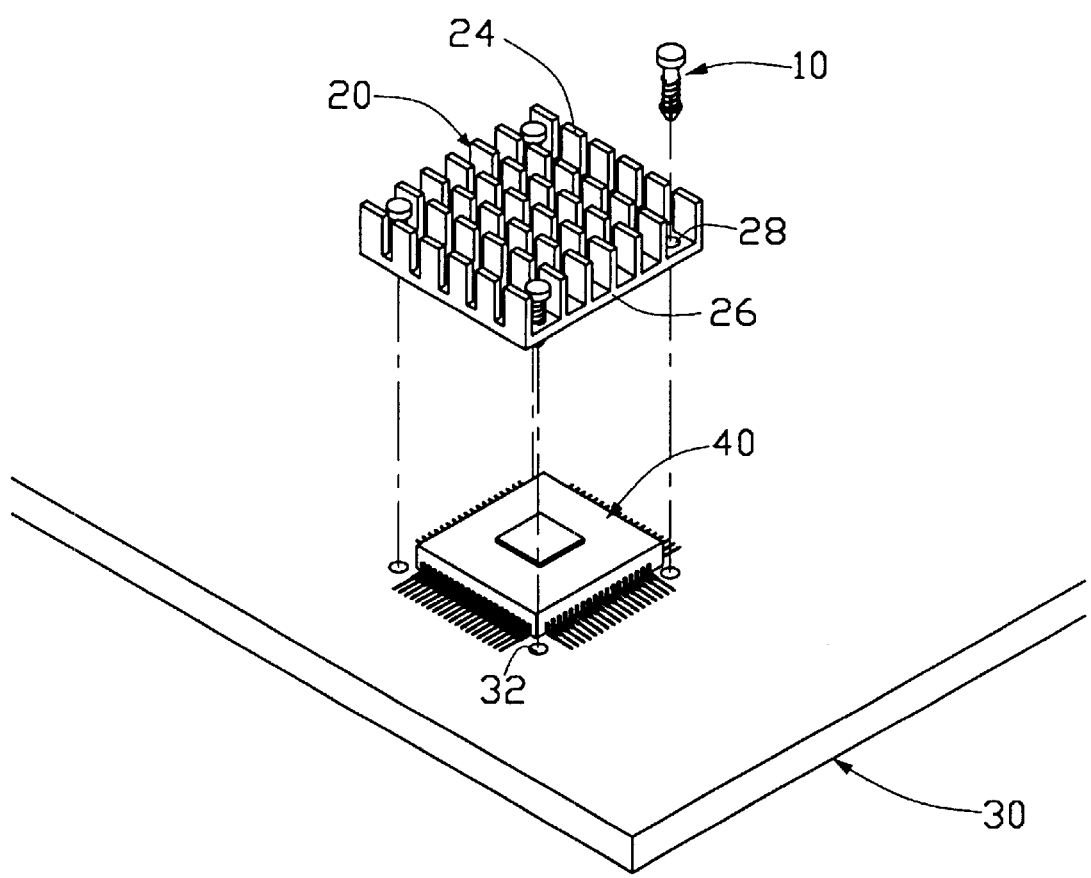
FIG. 6 is an exploded view of a conventional heat sink to be attached to a chip on a printed circuit board.
Figure 7:
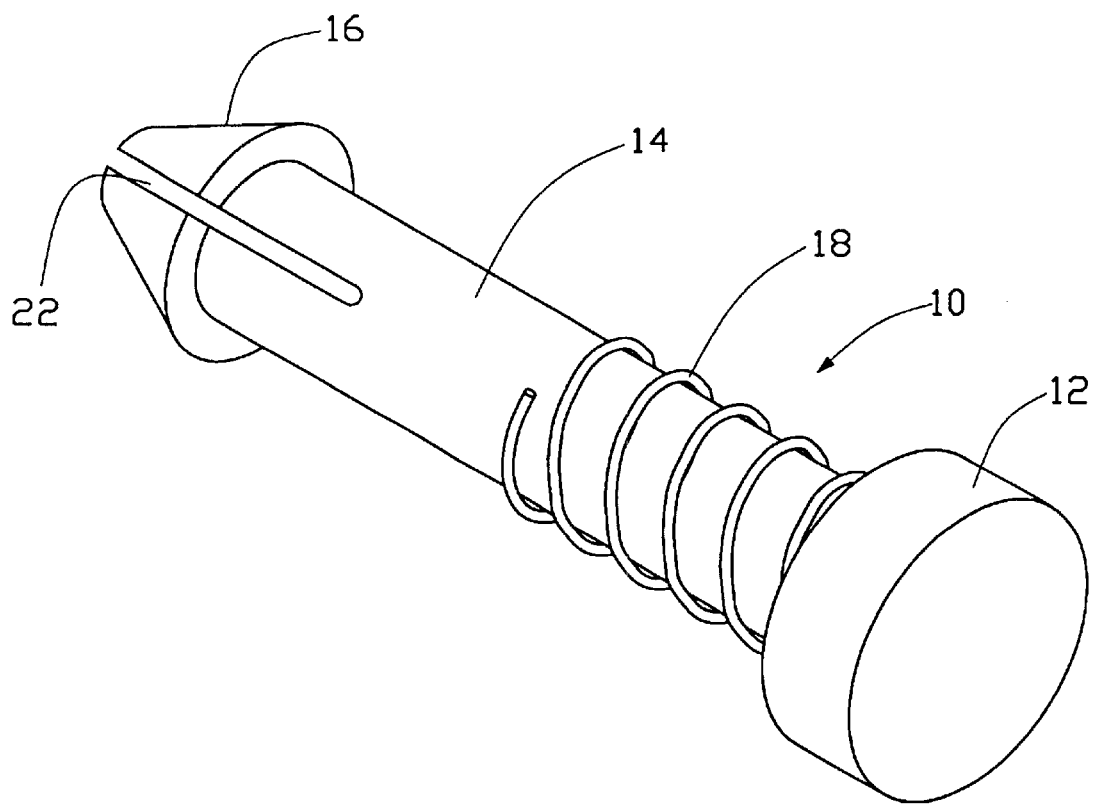
FIG. 7 is a perspective view of a pin of FIG. 6.

Referring to FIGS. 3–5, in assembly, the heat sink 80 is pressed to the chip 90 by the assembling device. The sleeves 50 extend through the corresponding apertures 84 of each ear 82 of the heat sink 80 with the springs 60 disposed there around. The clip 70 is placed under the printed circuit board 100, with each post 66 thereof extending through the corresponding hole 68 of the printed circuit board 100. Each post 66 extends into the corresponding cavity 62 of the hollow sleeve 50 until the neck 664 thereof engages with the smallest aperture 626 of the sleeve 50 to securely engage the clip 70 with the sleeves 50, the springs 60 being compressed. The heat sink 80 is firmly pressed to the chip 90 mounted on the printed circuit board 100 because of the compressed springs 60.

If desired, during disassembly, the cavity 62 of each sleeve 50 can be resiliently dilated to disengage from the corresponding post 66 of the clip 70 by pushing the two halves of the cap 52 of the sleeve 50 apart. Thus the assembled device is easily disengaged from the heat sink 80 and from the chip 90.

Additionally, since the post 66 penetrates but does not engage with the hole 68 of the printed circuit board 100, the dimension of the post 66 may be minimized to decrease the occupied area on the printed circuit board 100.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A heat dissipation device for an integrated circuit mounted on a printed circuit board, comprising:

a heat sink for positioning on the integrated circuit mounted on the printed circuit board, the heat sink comprising at least an ear defining an aperture therethrough; and an assembling device comprising a clip, at least a sleeve extending downwardly through the aperture of the ear of the heat sink, and at least a spring disposed between a top surface of the ear and a bottom surface of a cap of the sleeve, a cavity being defined lengthwise through the sleeve, the clip having at least a post for extending upwardly from a bottom face of the printed circuit board through a hole defined in the printed circuit board to be engagingly received in the cavity and have a snap engagement with the sleeve, wherein the sleeve further comprises a cylindrical section and a cone-shaped end, with the cylindrical section joining the cap and the end, the cylindrical section having a cross-section dimension smaller than that of the cap and the end.

2. The heat dissipation device as described in claim 1, wherein a slot is defined in the cap and the cylindrical section to provide resilience thereto.

3. An assembling device for securing a heat sink to an integrated circuit mounted to a printed circuit board, comprising:

a clip having at least a post for extending upwardly from a bottom face of the circuit board through a hole defined in the printed circuit board;

at least a sleeve comprising a cap, and a cylindrical section depending from the cap and extending through an aperture of the heat sink, a cavity being defined lengthwise through the sleeve and forming an engaging means therein for snaply engagingly receiving the post of the clip, the sleeve further comprising a cone-shaped end, wherein the cylindrical section has a cross-sectional dimension smaller than that of the cap and the end; and at least a spring disposed around the sleeve and between the cap of the sleeve and a top surface of the heat sink, adapted for resiliently pressing the heat sink to the integrated circuit mounted on the printed circuit board.

4. The assembling device as described in claim 3, wherein a slot is defined in the cap and the cylindrical section to provide resilience thereto.

* * * * *